US006777739B2

(12) United States Patent
Agarwal et al.

(10) Patent No.: US 6,777,739 B2
(45) Date of Patent: Aug. 17, 2004

(54) MULTILAYER ELECTRODE FOR A FERROELECTRIC CAPACITOR

(75) Inventors: Vishnu K. Agarwal, Boise, ID (US); Garo J. Derderian, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/930,960

(22) Filed: Aug. 17, 2001

(65) Prior Publication Data

US 2001/0052609 A1 Dec. 20, 2001

Related U.S. Application Data

(63) Continuation of application No. 09/310,408, filed on May 12, 1999, now Pat. No. 6,297,527.

(51) Int. Cl.[7] .............................................. H01L 31/119
(52) U.S. Cl. ...................... 257/306; 257/296; 257/303
(58) Field of Search ............................. 257/306, 295, 257/296, 303, 768, 769; 361/302, 303, 305; 438/3, 240, 396, 397, 785

(56) References Cited

U.S. PATENT DOCUMENTS

| | | | |
|---|---|---|---|
| 5,053,917 A | 10/1991 | Miyasaka et al. | |
| 5,453,347 A | 9/1995 | Bullington et al. | |
| 5,581,436 A | 12/1996 | Summerfelt et al. | |
| 5,645,976 A | 7/1997 | Azuma | |
| 5,751,540 A | 5/1998 | Lee et al. | |
| 5,790,366 A | 8/1998 | Desu et al. | |
| 5,793,076 A | 8/1998 | Fazan et al. | |
| 5,796,134 A | 8/1998 | Kim | |
| 6,180,974 B1 * | 1/2001 | Okutoh et al. | 257/306 |
| 6,201,271 B1 * | 3/2001 | Okutoh et al. | 257/295 |
| 6,297,527 B1 * | 10/2001 | Agarwal et al. | 257/306 |

* cited by examiner

*Primary Examiner*—Phat X. Cao
*Assistant Examiner*—Theresa T. Doan
(74) *Attorney, Agent, or Firm*—Dickstein Shapiro Morin & Oshinsky LLP (57) ABSTRACT

A ferroelectric or high dielectric constant capacitor having a multilayer lower electrode comprising at least two layers—a platinum layer and a platinum-rhodium layer—for use in a random access memory (RAM) cell. The platinum layer of the lower electrode adjoins the capacitor dielectric, which is a ferroelectric or high dielectric constant dielectric such as BST, PZT, SBT or tantalum pentoxide. The platinum-rhodium layer serves as an oxidation barrier and may also act as an adhesion layer for preventing separation of the lower electrode from the substrate, thereby improving capacitor performance. The multilayer electrode may have titanium and/or titanium nitride layers under the platinum-rhodium layer for certain applications. The capacitor has an upper electrode which may be a conventional electrode or which may have a multilayer structure similar to that of the lower electrode. Processes for manufacturing the multilayer lower electrode and the capacitor are also disclosed.

53 Claims, 12 Drawing Sheets

MULTILAYER ELECTRODE FOR A FERROELECTRIC CAPACITOR

CROSS-REFERENCE TO RELATED APPLICATIONS

This patent application is a continuation of U.S. patent application Ser. No. 09/310,408, filed on May 12, 1999 now U.S. Pat. No. 6,297,527, entitled MULTILAYER ELECTRODE FOR A FERROELECTRIC CAPACITOR.

FIELD OF THE INVENTION

The present invention relates generally to a ferroelectric or high dielectric constant capacitor with a multilayer electrode, and in particular to a ferroelectric or high dielectric constant capacitor which is used in a memory cell in a random access memory (RAM), and to a process for its formation.

BACKGROUND OF THE INVENTION

A dynamic random access memory (DRAM) cell typically comprises a charge storage capacitor (or cell capacitor) coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance $C = \varepsilon \varepsilon_o A/d$, where $\varepsilon$ is the dielectric constant of the capacitor dielectric, $\varepsilon_o$ is the vacuum permittivity, A is the electrode (or storage node) area, and d is the interelectrode spacing. The conditions of DRAM operation such as operating voltage, leakage rate and refresh rate, will in general mandate that a certain minimum charge be stored by the capacitor.

In the continuing trend to higher memory capacity, the packing density of storage cells must increase, yet each will maintain required capacitance levels. This is a crucial demand of DRAM fabrication technologies if future generations of expanded memory array devices are to be successfully manufactured. Nevertheless, in the trend to higher memory capacity, the packing density of cell capacitors has increased at the expense of available cell area. For example, the area allowed for a single cell in a 64-Mbit DRAM is only about 1.4 $\mu m^2$. In such limited areas, it is difficult to provide sufficient capacitance using conventional stacked capacitor structures. Yet, design and operational parameters determine the minimum charge required for reliable operation of the memory cell despite decreasing cell area. Several techniques have been developed to increase the total charge capacity of the cell capacitor without significantly affecting the cell area. These include new structures utilizing trench and stacked capacitors, electrodes having textured surface morphology and new capacitor dielectric materials having higher dielectric constants.

As DRAM density has increased (1 MEG and beyond) thin film capacitors, such as stacked capacitors, trenched capacitors, or combinations thereof, have evolved in attempts to meet minimum space requirements. Many of these designs have become elaborate and difficult to fabricate consistently as well as efficiently. Furthermore, the recent generations of DRAMs (4 MEG and 16 MEG, for example) have pushed thin film capacitors technology to the limit of processing capability. Thus, greater attention has been given to the development of thin film dielectric materials that possess a dielectric constant significantly greater (>10x) than the conventional dielectrics used today, such as silicon oxides or nitrides.

Recently, a lot of attention has been paid to Barium Strontium Titanate (BST), Barium Titanate (BT), Strontium Titanate (ST), Lead Zirconate Titanate (PZT) and other high dielectric constant materials as a cell dielectric material of choice of DRAMs. These materials, in particular BST, have a high dielectric constant (>300) and low leakage currents which makes them very attractive for high density memory devices. However, there are some technical difficulties associated with these materials. One problem with incorporating these materials into present day DRAM cell designs is their chemical reactivity with the polycrystalline silicon (polysilicon or "poly") that conventionally forms the capacitor electrode or a buried electrode contact. Capacitors made by polysilicon-PZT/BST sandwiches undergo chemical and physical degradation with thermal processing. During chemical vapor deposition (CVD) of PZT/BST, oxygen in the ambient tends to oxidize the electrode material. The oxide is undesirable because it has a much lower dielectric constant compared to PZT/BST, and adds in series to the capacitance of the PZT/BST, thus drastically lowering the total capacitance of the capacitor. Therefore, even a thin native oxide layer present on the electrode results in a large degradation in capacitance. Furthermore, even when the electrode proper is made of a noble metal, such as Pt, oxygen will still tend to diffuse through it, contaminating the underlying polycrystalline silicon plug.

Ferroelectric memory devices have been proposed as alternatives to conventional memory devices. Ferroelectric memory devices utilize the spontaneous polarization properties of ferroelectric films to provide data storage elements which offer relatively fast read/write operations compared with conventional storage elements. In addition, using a capacitor having a ferroelectric dielectric as a data storage device for a memory cell can reduce the power consumption of the memory cell and increase operational speed as refresh operations typically are not required to maintain data in the capacitor. Moreover, such a ferroelectric random access memory (FRAM) device may operate from a single power supply voltage.

Generally, two types of FRAM cells are conventionally used: (1) a transistor employing a ferroelectric film as a gate insulation film, and (2) an access transistor connected to a cell capacitor employing a ferroelectric film as a dielectric. Fabrication difficulties associated with the first type of cell include the potential formation of a silicon oxide film by reaction of silicon with oxygen atoms at the interface between the silicon channel region of the transistor and the ferroelectric gate insulation film. In addition, it may be difficult to form a high-quality ferroelectric film due to a lattice constant difference or thermal expansion coefficient difference between the silicon substrate and ferroelectric film.

For these reasons, conventional FRAM devices tend to employ the second structure described above, wherein a cell capacitor uses a ferroelectric dielectric material as a dielectric. Typically, barium strontium titanate (BST) or lead zirconate titanate (PZT) are used for the capacitor dielectric. According to a typical fabrication process, BST or PZT is deposited by a sol-gel process. The annealing temperature of 500 to 650 degrees Celsius used during the heat treatment phase of the sol-gel process may deform a conventional aluminum electrode, or oxidize a tungsten electrode. Therefore, the lower electrode of a ferroelectric capacitor is typically made of platinum because it has a high oxidation resistance and a high melting point.

Platinum is an excellent lower electrode material to use with ferroelectric and high dielectric constant (HDC) dielectric materials. Platinum provides a low energy crystallization surface which catalyzes the formation of perovskite crystals, it maintains its electrical properties at the crystallization temperatures routinely used for sintering ferroelectric and HDC materials, and it is highly compatible with the ferroelectric properties of ferroelectric dielectric materials.

There are disadvantages to using platinum as an electrode, however, which are generally related to semiconductor process integration. Platinum generally allows oxygen to diffuse through it and hence typically allows neighboring materials to oxidize. Platinum also does not normally adhere well to traditional dielectrics such as silicon dioxide, and the high degree of stress placed on the platinum-silicon dioxide bond generated by the crystallization of the ferroelectric or HDC dielectric material peels the platinum off the substrate during processing. It may also rapidly form a silicide at low temperatures, and also may form hillocks which degrade leakage current properties or short out the capacitor. In addition, alpha-particle creation by the radioactive isotope of platinum (Pt-190), which is typically present as a small percentage of the total platinum atoms in a sample, may be detrimental to the electrical functioning of the capacitor.

There is needed, therefore an improved lower electrode for a ferroelectric or high dielectric constant capacitor having the advantages of a platinum electrode while avoiding problems of oxidation and separation from the substrate. A simple method of fabricating an improved lower electrode is also needed.

BRIEF SUMMARY OF THE INVENTION

The present invention provides a ferroelectric or high dielectric constant capacitor with a multilayer lower electrode for use in a RAM or FRAM memory cell. The multilayer lower electrode has at least two layers—a platinum layer adjacent the dielectric, and a platinum-rhodium layer beneath the platinum layer. The platinum-rhodium layer serves as an oxidation barrier and may also act as an adhesion layer for preventing separation of the lower electrode from the substrate, thereby improving capacitor performance. Titanium and/or titanium nitride layers may be used under the platinum-rhodium layer if desired. A ferroelectric or HDC dielectric material is used as the capacitor dielectric, and the upper electrode may take the form of a conventional upper electrode, or may have the same multilayer structure as the lower electrode. Also provided are processes for manufacturing the multilayer lower electrode.

Additional advantages and features of the present invention will be apparent from the following detailed description and drawings which illustrate preferred embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "high dielectric constant dielectric material" or "HDC dielectric material" as used herein refers to dielectric materials having high dielectric constants ($\in = \sim 20$ or higher), and including, but not limited to barium strontium titanate (BST or $Ba_xSr_{(1-x)}TiO_3$), lead zirconate titanate (PZT or $PbZr_{(1-x)}Ti_xO_3$), lead lanthanum zirconate titanate (PLZT), lead scandium tantalate (PST), strontium bismuth tantalate (SBT or $SrBi_2Ta_2O_9$), barium bismuth tantalate (BBT or $BaBi_2Ta_2O_9$), barium titanate (BT or $BaTiO_3$), strontium titanate (ST or $SrTiO_3$), tantalum pentoxide ($Ta_2O_5$), and other metallic oxides having perovskite or ilmenite crystal structures and high dielectric constants ($\in$=~20 or higher). The following detailed description is, therefore, not to be taken in a limiting sense, and the scope of the present invention is defined by the appended claims.

Figure 1:
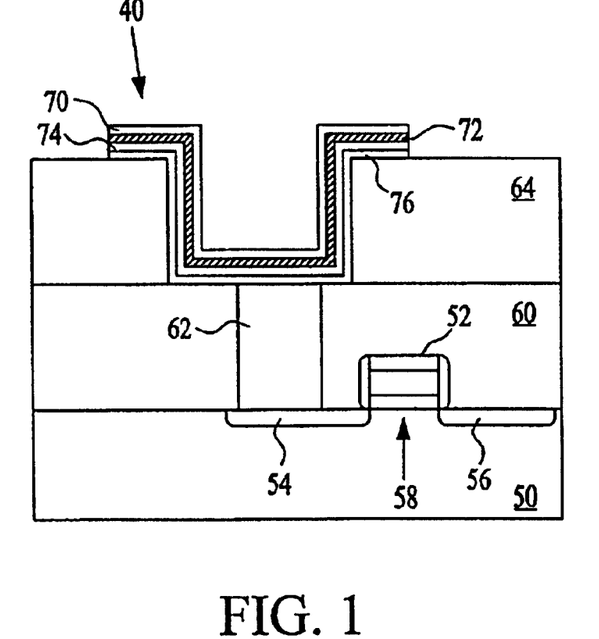
FIG. 1 is a cross-sectional view of the ferroelectric capacitor of a preferred embodiment of the present invention.

Referring now to the drawings, where like elements are designated by like reference numerals, an embodiment of the capacitor 40 of the present invention is shown in FIG. 1. The capacitor 40 is formed on a silicon substrate 50 having word line 52 and active areas 54, 56 forming a transistor 58 thereon. An oxide layer 60 of a material such as silicon dioxide is formed over the transistor 58, and a conductive plug 62 of doped polysilicon, tungsten, or other suitable material extends through the oxide layer 60 to form a contact to active area 54. Protective layer 64 is formed over the oxide layer 60, and is of a material such as borophosphosilicate glass (BPSG), borosilicate glass (BSG), phosphosilicate glass (PSG), or silicon dioxide. The capacitor 40 is formed in the protective layer 64 over the conductive plug 62.

The capacitor 40 comprises an upper electrode 70, a dielectric layer 72, and a lower electrode having multiple layers. The upper electrode 70 may be comprised of any suitable material such as titanium nitride, tungsten, tungsten nitride, platinum, palladium, tantalum, tantalum nitride, aluminum, molybdenum, polysilicon, or other semiconductor conducting materials, or may have a structure identical to that of an embodiment of the lower electrode of this invention, as is further described below. The dielectric layer 72 may be any HDC dielectric material described above, but preferably is BST, PZT, SBT, or tantalum pentoxide, and has a thickness of less than about 5000 Angstroms, preferably less than about 500 Angstroms.

Figure 2:
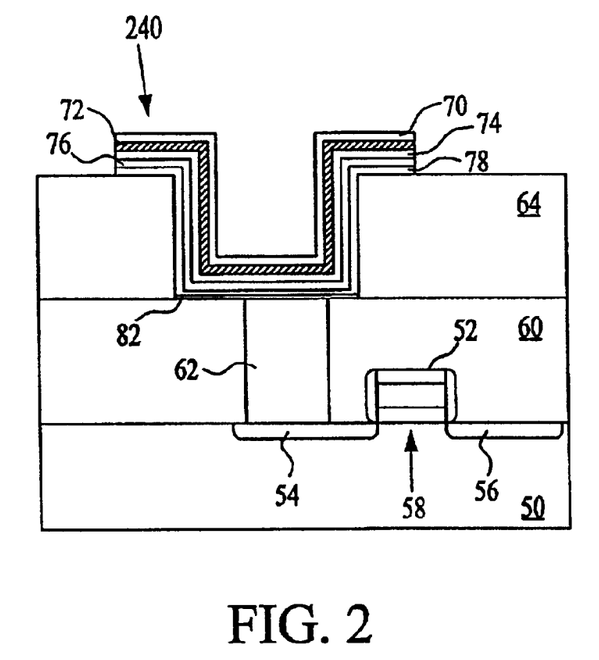
FIG. 2 is a cross-sectional view of the ferroelectric capacitor of a second embodiment of the present invention.
Figure 3:
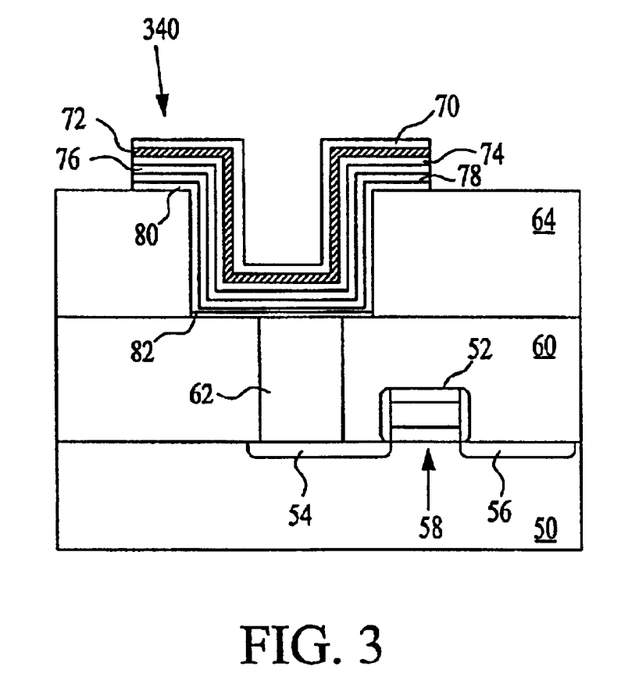
FIG. 3 is a cross-sectional view of the ferroelectric capacitor of a third embodiment of the present invention.

As shown in FIGS. 1 through 3, the lower electrode comprises at least two layers—a platinum layer 74 and a platinum-rhodium layer 76—formed on the protective layer 64. FIG. 2 depicts a capacitor 240 of a second embodiment, in which the lower electrode has an additional titanium layer 78 formed between the platinum-rhodium layer 76 and the protective layer 64, and FIG. 3 shows a capacitor 340 of a third embodiment, in which an additional titanium nitride layer 80 is present between the titanium layer 78 and the protective layer 64. The capacitors 240, 340 of the second and third embodiments may also have a silicide layer 82 formed between the lower electrode and the protective layer 64 as a result of the fabrication process, as shown in FIGS. 2 and 3.

Referring now to FIGS. 1 through 3, the platinum layer 74 of the lower electrode is typically about 50 to about 300 Angstroms thick, preferably about 50 to about 150 Angstroms, and the platinum-rhodium layer 76 is typically from about 100 to about 800 Angstroms thick, preferably about 150 to about 300 Angstroms. The platinum-rhodium layer 76 is comprised of an alloy having a composition of approximately 3 to approximately 40 percent rhodium and approximately 97 to approximately 60 percent platinum by weight. The titanium layer 78 of the lower electrode, if it is present, is about 60 to about 200 Angstroms thick, preferably about 60 to about 100 Angstroms, and the titanium nitride layer 80 is about 100 to about 200 Angstroms thick, preferably about 100 to about 150 Angstroms.

Figure 4:
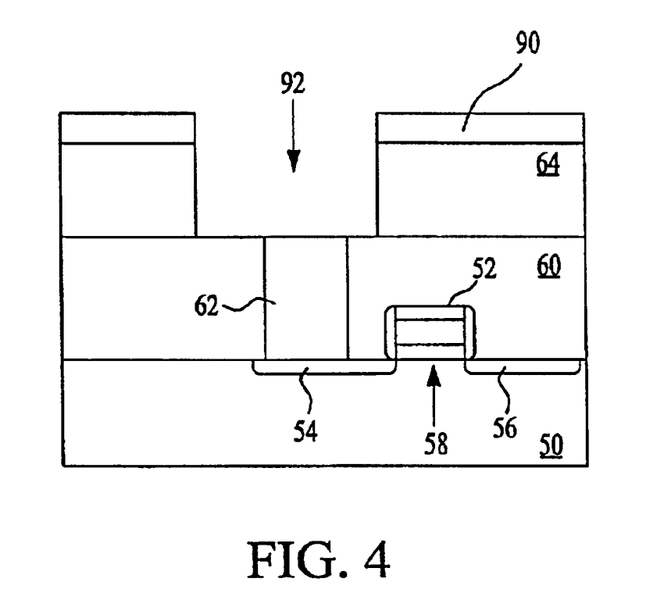
FIG. 4 is a cross-sectional view of a semiconductor substrate having transistors and an insulating layer formed thereon.

The capacitor 40 is manufactured through a process that begins with the structure illustrated by FIG. 4. The process begins subsequent to the formation of the word line 52, active areas 54, 56, oxide layer 60, conductive plug 62 and protective layer 64. A resist 90 (not shown) is applied, and photolithographic techniques are used to define an area to be etched-out. An etching process such as wet etching using an acid such as nitric and/or hydrofluoric acid, or dry etching methods such as plasma etching or reactive ion etching (RIE) is used to etch through the protective layer 64 to expose the conductive plug 62 and form a trench 92, as shown in FIG. 4. The photoresist is then stripped.

Figure 5:
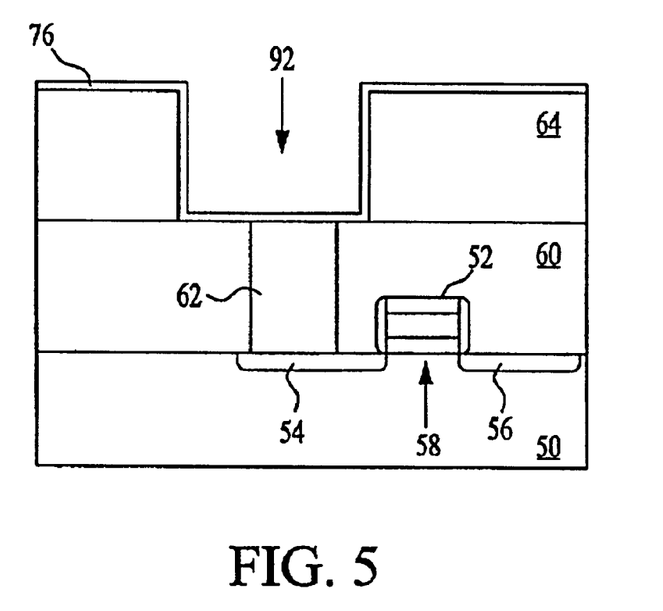
FIG. 5 shows the substrate of FIG. 4 undergoing the process of a preferred embodiment of the present invention.

The capacitor 40 of the preferred embodiment is then manufactured through a process described as following, and illustrated by FIGS. 5 through 8. As shown in FIG. 5, the first step in the process is to form the platinum-rhodium layer 76 on the surface of the protective layer 64 and in the trench 92. This layer may be formed by means such as chemical vapor deposition (CVD), physical vapor deposition (PVD), sputtering, evaporation, or other suitable means, and is formed to a thickness of about 100 to about 800 Angstroms, preferably about 150 to about 300 Angstroms. The platinum-rhodium layer 76 is an alloy comprising approximately 3 to approximately 40 percent rhodium and approximately 97 to approximately 60 percent platinum by weight.

Figure 6:
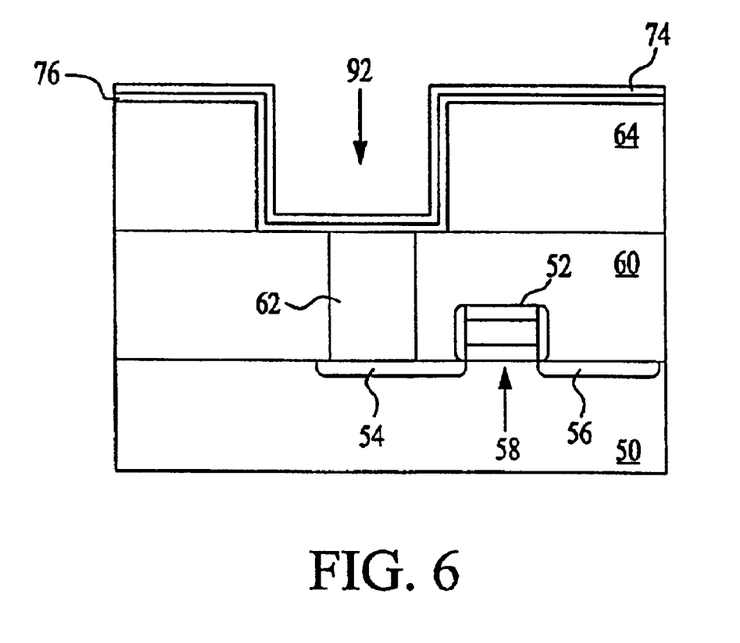
FIG. 6 shows the substrate of FIG. 5 at a processing step subsequent to that shown in FIG. 5.

FIG. 6 depicts the next step, in which the platinum layer 74 is formed on the surface of the platinum-rhodium layer 76 by suitable means such as CVD, PVD, sputtering, or evaporation. This layer has a thickness of about 50 to about 300 Angstroms, preferably about 50 to about 150 Angstroms. A preferred method of forming the platinum-rhodium and platinum layers 76, 74 is in-situ CVD. In this method, the substrate 50 is placed in a CVD reactor, and platinum and rhodium precursors are introduced into the reactor chamber to form the platinum-rhodium layer 76. When the platinum-rhodium layer 76 has been formed to the desired thickness, the flow of rhodium precursor is shut off so that the platinum layer 74 may then be formed. Another preferred method of forming these layers uses a CVD reactor with two ampoules. The first ampoule is charged with a mixture of platinum and rhodium precursors, and the second ampoule is charged only with platinum precursors. The platinum-rhodium layer 76 is formed using the first ampoule, and then the platinum layer 74 is formed using the second ampoule. This method achieves better process stability than other known methods.

Figure 7:
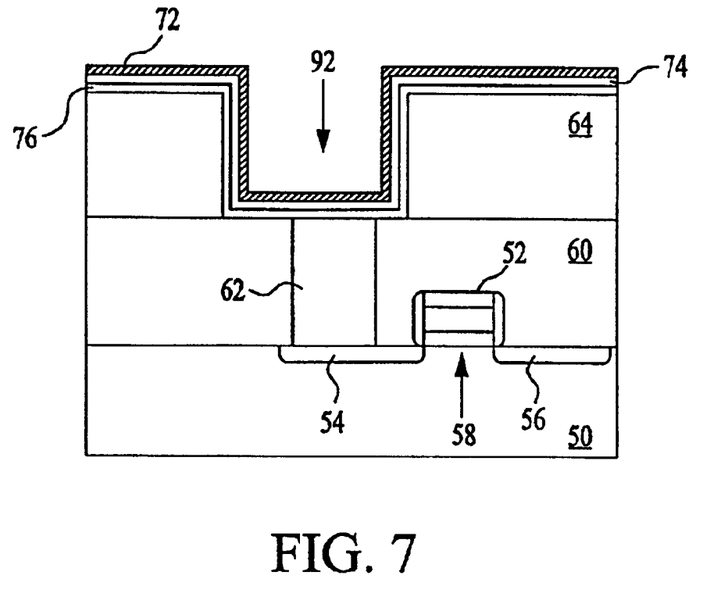
FIG. 7 shows the substrate of FIG. 5 at a processing step subsequent to that shown in FIG. 6.

The dielectric layer 72 is then formed over the platinum layer 74, as illustrated by FIG. 7. The dielectric layer 72, which may be a layer of any of the HDC dielectric materials described above, is then formed. The HDC dielectric material, which is preferably BST, PZT, SBT, or tantalum pentoxide, may be formed by any suitable process such as spinning, sputtering, CVD, ion beam sputtering, laser beam deposition, molecular beam epitaxy (MBE), evaporation, or a sol-gel process. Typically a sol-gel process is used. In this process, a solution or sol containing the desired oxide or non-oxide precursor is formulated and applied to the surface of the platinum layer 74 by spinning, dipping or draining. The resultant dielectric layer 72 is then dried at a low temperature, e.g., 100 degrees Celsius, and then treated by exposing it to high temperatures (300 to 1100 degrees Celsius) for a period of time sufficient to drive water and solvent out of the layer and to form a hard dielectric layer 72.

Figure 8:
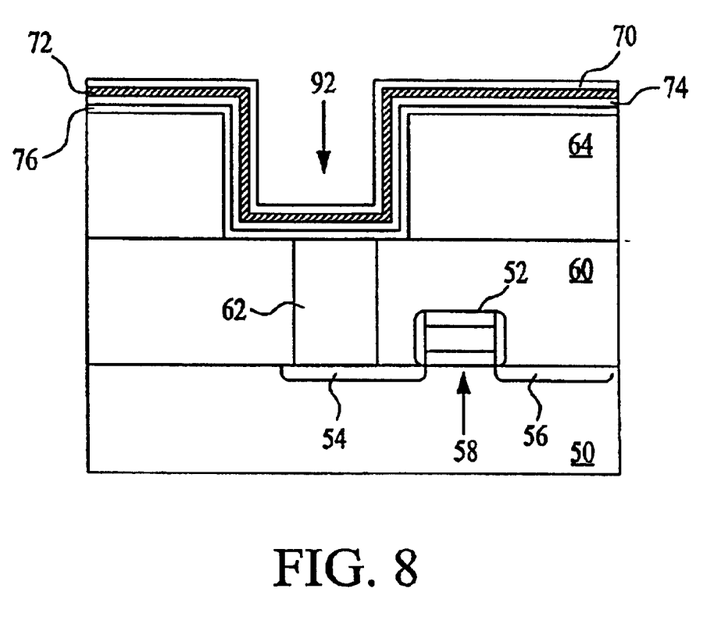
FIG. 8 shows the substrate of FIG. 5 at a processing step subsequent to that shown in FIG. 7.

Referring now to FIG. 8, the upper electrode 70 is formed on the dielectric layer. The upper electrode 70 may be a single layer of suitable conductive material such as titanium nitride, tungsten nitride, platinum, or polysilicon, or may have a multilayer structure identical to that of the lower electrode, with a platinum layer and a platinum-rhodium layer. CVD, PVD, sputtering, evaporation, or other suitable means may be used to form the upper electrode 70, and the means chosen will vary depending on the desired structure and materials, as is known in the art. The capacitor 40 now appears as shown in FIG. 8. Further steps to create a functional memory cell containing the capacitor 40 may now be carried out, such as the formation and etching of insulating layers, e.g., BPSG, PSG, BSG, silicon dioxide or the like, to form conduits for electrical contacts (not shown), and for additional insulating, passivating, and wiring interconnect layers.

Figure 9:
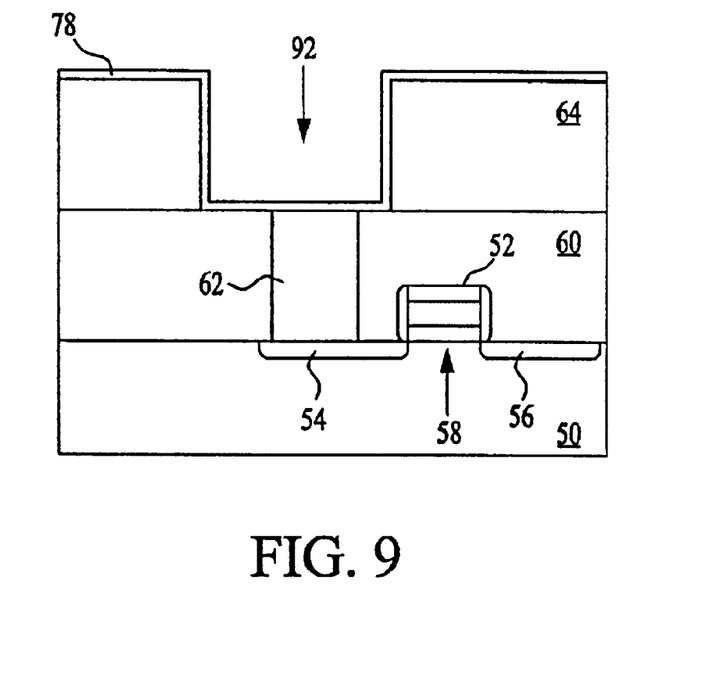
FIG. 9 shows the substrate of FIG. 4 undergoing the process of a second embodiment of the present invention.
Figure 10:
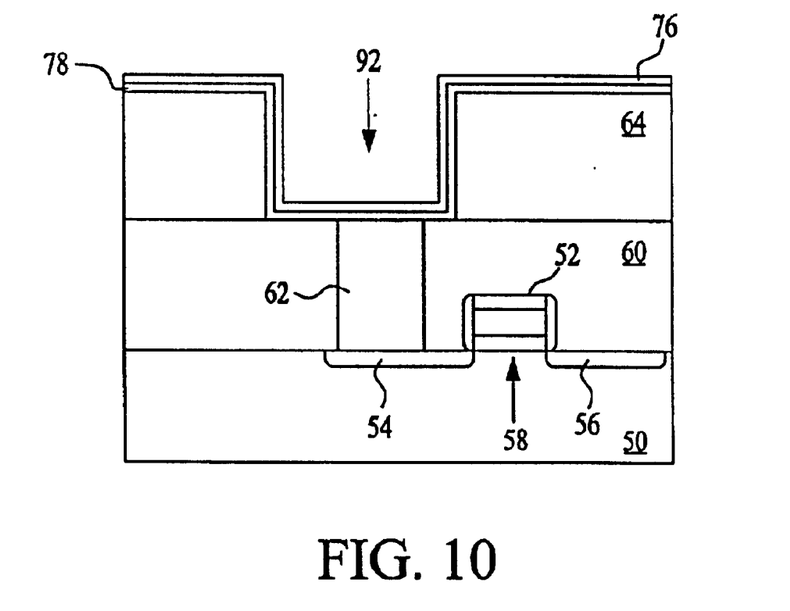
FIG. 10 shows the substrate of FIG. 9 at a processing step subsequent to that shown in FIG. 9.

A second embodiment of the capacitor 240 may be manufactured starting with the structure of FIG. 4 by a process depicted in FIGS. 9 through 14, and as described below. Referring to FIG. 9, a titanium layer 78 is formed on the surface of the protective layer 64 and in the trench 92 by means such as CVD, PVD, sputtering or evaporation. The titanium layer is formed to a thickness of about 60 to about 200 Angstroms, preferably about 60 to about 100 Angstroms. Next, as shown in FIG. 10, the platinum-rhodium layer 76 is formed by a suitable process such as CVD, as explained with reference to FIG. 5 above.

Figure 11:
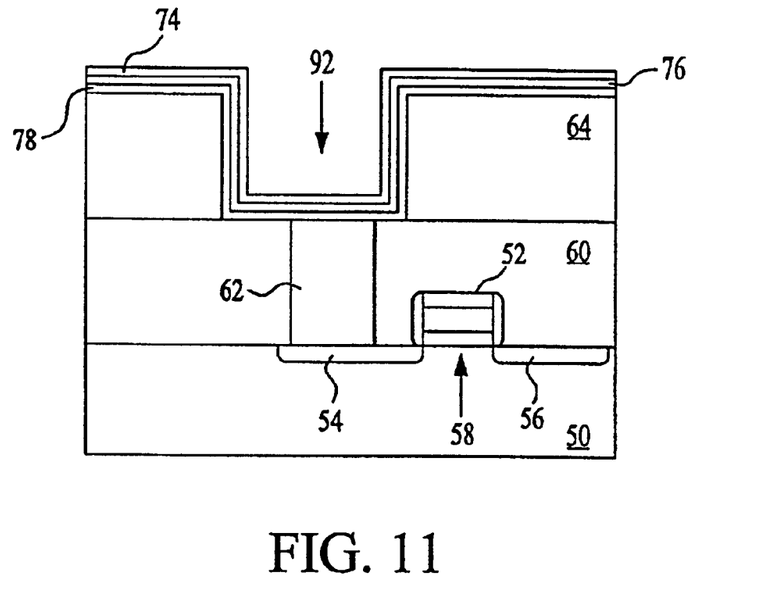
FIG. 11 shows the substrate of FIG. 9 at a processing step subsequent to that shown in FIG. 10.
Figure 12:
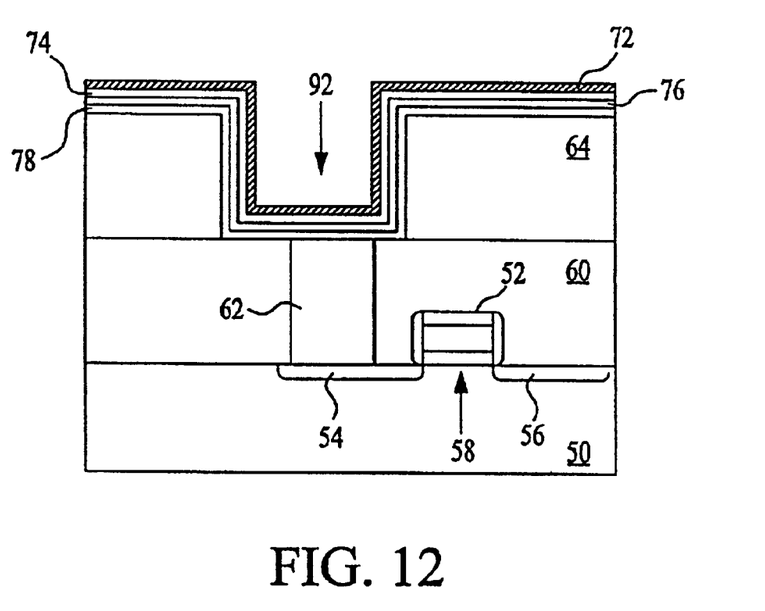
FIG. 12 shows the substrate of FIG. 9 at a processing step subsequent to that shown in FIG. 11.
Figure 13:
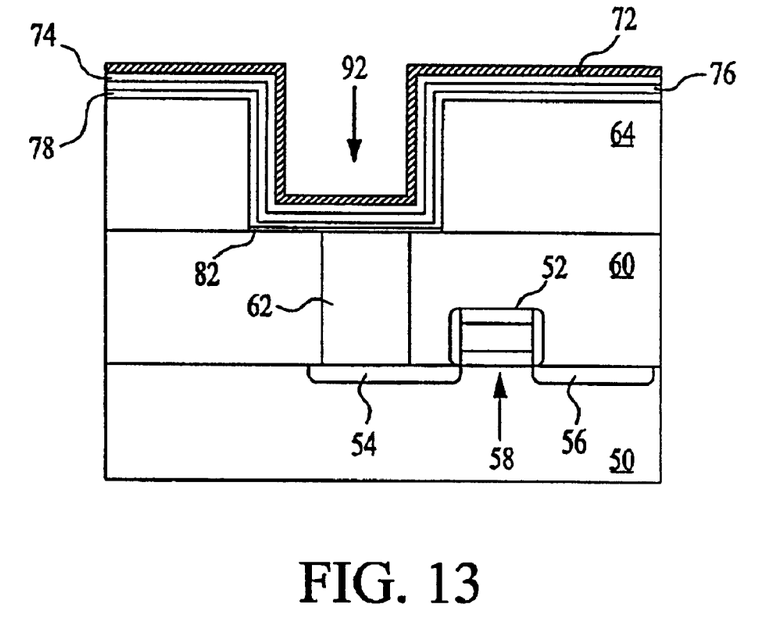
FIG. 13 shows the substrate of FIG. 9 at a processing step subsequent to that shown in FIG. 12.

FIG. 11 depicts the next step in which the platinum layer 74 is formed on the surface of the platinum-rhodium layer 76. The dielectric layer 72 is then formed on the platinum-rhodium layer 76 by a sol-gel process, as shown in FIG. 12. During the heat treatment phase of the sol-gel process, a silicide layer 82 may be formed by an interaction between the titanium layer 78 and silicon of the oxide layer 60 and/or the conductive plug 62, depending on the material of the conductive plug 62, as shown in FIG. 13. Formation of the silicide layer 82 results in a lower contact resistance between the titanium layer 78 and the conductive plug 62.

Figure 14:
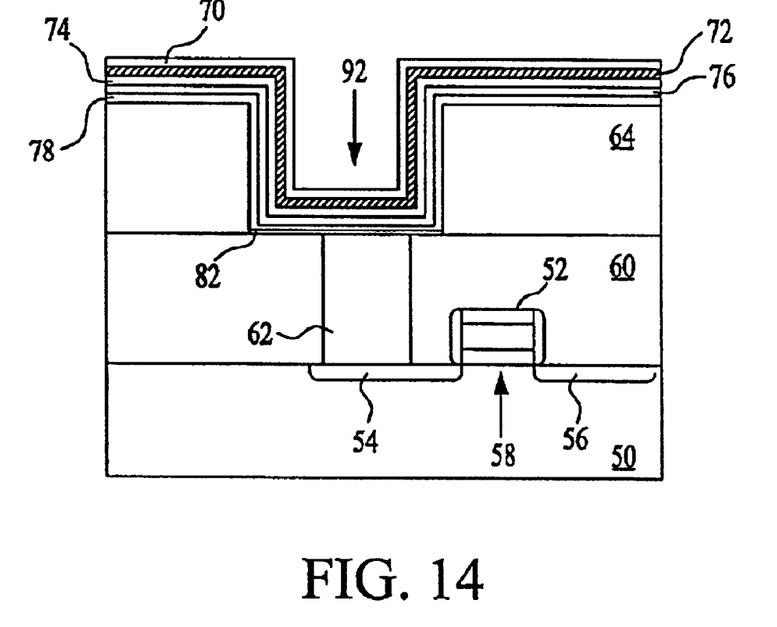
FIG. 14 shows the substrate of FIG. 9 at a processing step subsequent to that shown in FIG. 13.

Referring now to FIG. 14, the upper electrode 70 is formed on the dielectric layer, and may be a single layer of suitable conductive material, or a multilayer structure identical to that of the lower electrode, as is described above with reference to FIG. 8. The capacitor 240 now appears as shown in FIG. 14. Further steps to create a functional memory cell containing the capacitor may now be carried out, such as the formation and etching of insulating layers, e.g., BPSG, PSG, BSG, silicon dioxide or the like, to form conduits for electrical contacts (not shown), and for additional insulating, passivating, and wiring interconnect layers.

Figure 15:
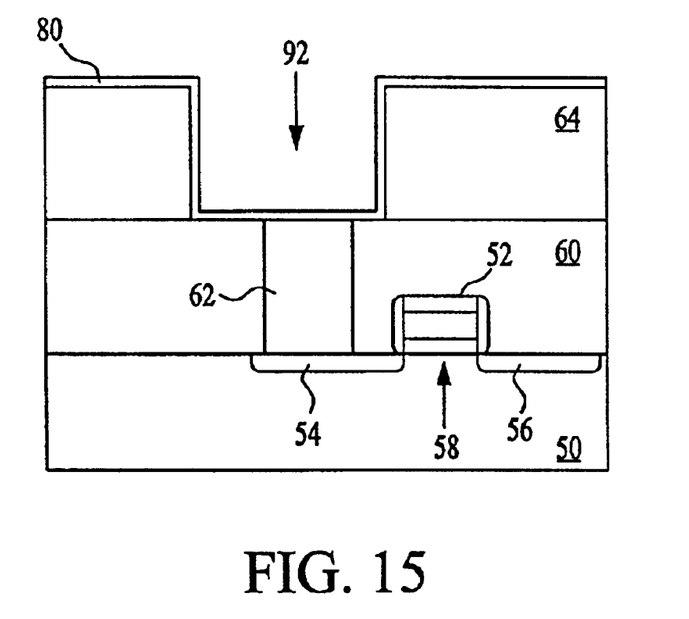
FIG. 15 shows the substrate of FIG. 4 undergoing the process of a third embodiment of the present invention.
Figure 16:
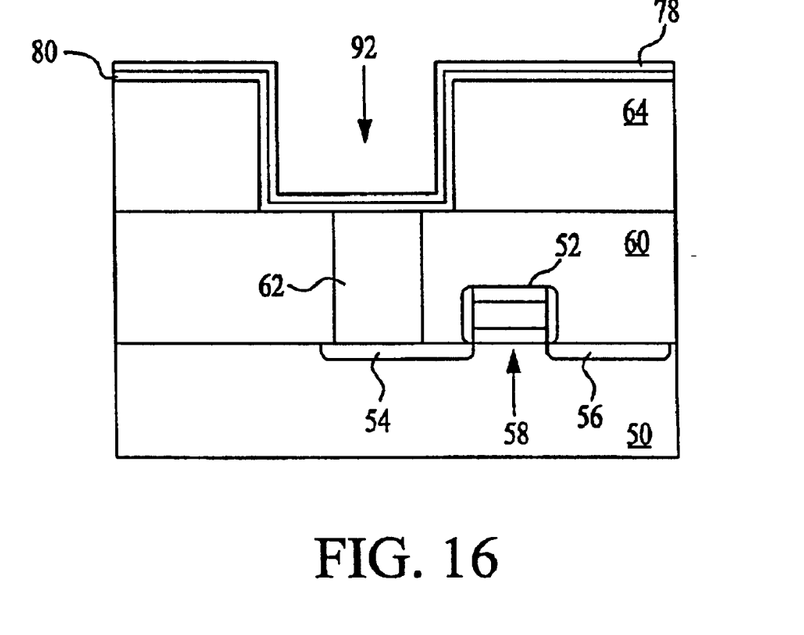
FIG. 16 shows the substrate of FIG. 15 at a processing step subsequent to that shown in FIG. 15.
Figure 17:
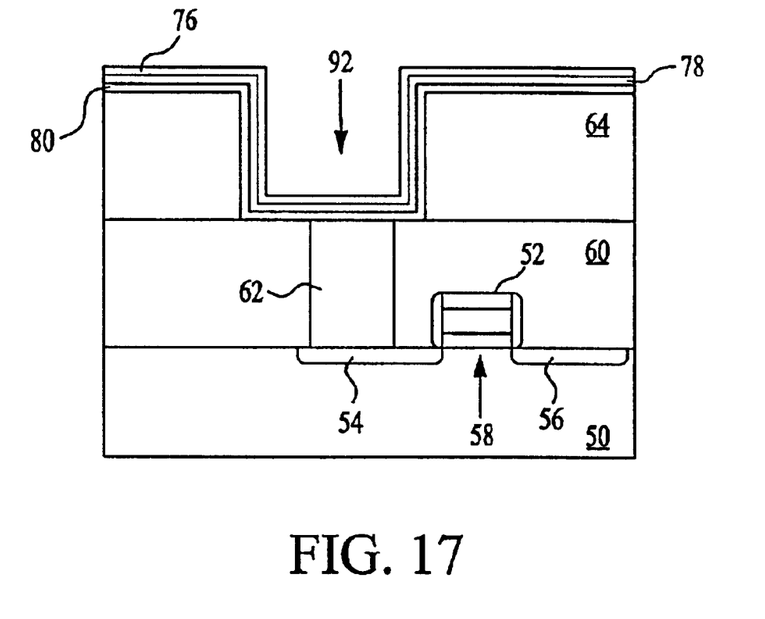
FIG. 17 shows the substrate of FIG. 15 at a processing step subsequent to that shown in FIG. 16.

A third embodiment of the capacitor 340 may be manufactured starting with the structure of FIG. 4 by a process depicted in FIGS. 15 through 21, and as described below. Referring to FIG. 15, a titanium nitride layer 80 is formed on the surface of the protective layer 64 and in the trench 92 by means such as CVD, PVD, sputtering or evaporation. The titanium nitride layer 80 is formed to a thickness of about 100 to about 200 Angstroms thick, preferably about 100 to about 150 Angstroms. Next, as shown in FIGS. 16 and 17, the titanium layer 78 and platinum-rhodium layer 76 are formed by suitable processes such as CVD, as explained with reference to FIGS. 9 and 10 above.

Figure 18:
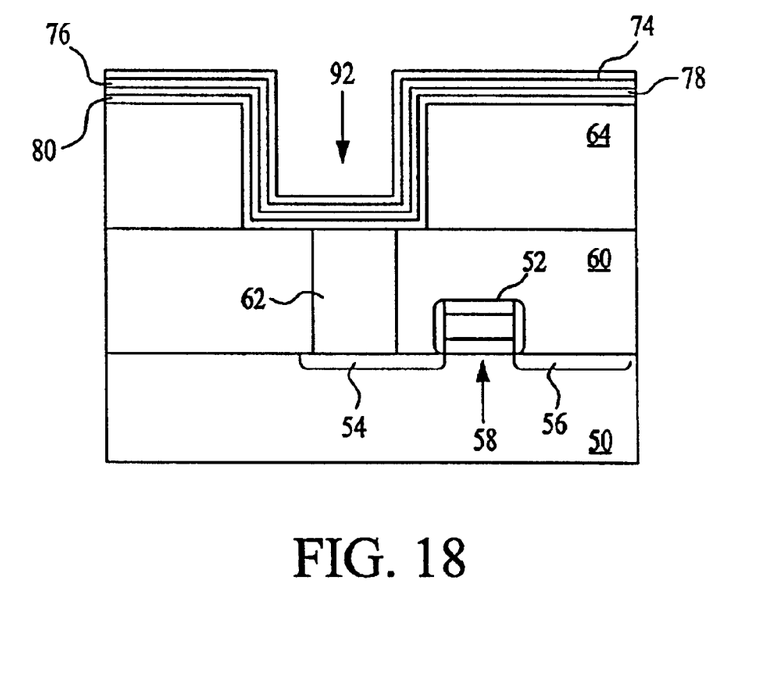
FIG. 18 shows the substrate of FIG. 15 at a processing step subsequent to that shown in FIG. 17.
Figure 19:
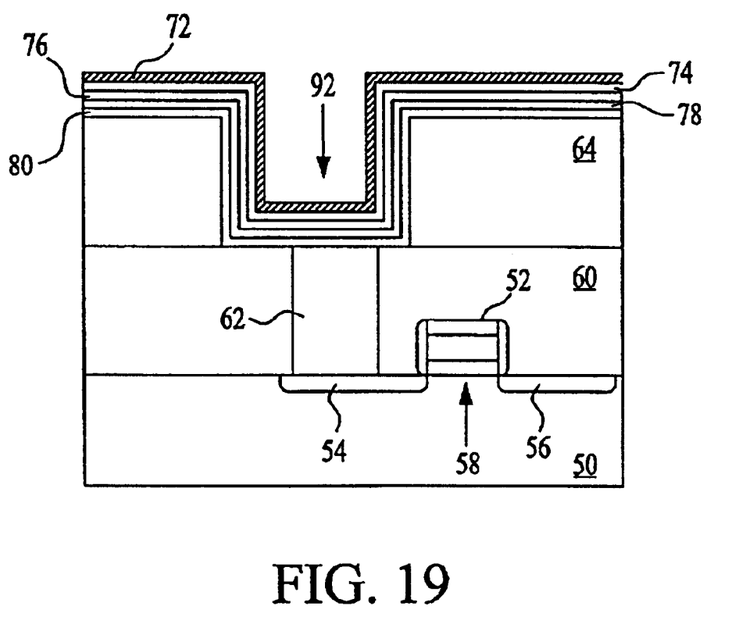
FIG. 19 shows the substrate of FIG. 15 at a processing step subsequent to that shown in FIG. 18.
Figure 20:
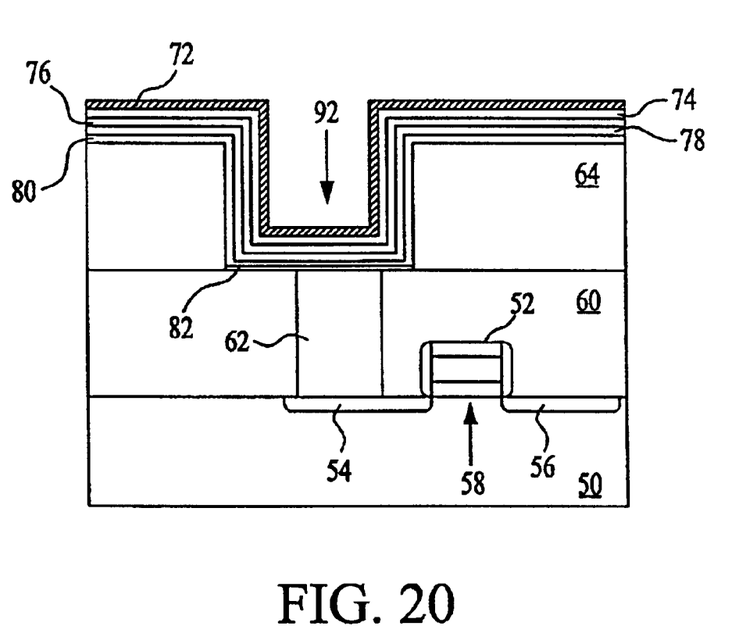
FIG. 20 shows the substrate of FIG. 15 at a processing step subsequent to that shown in FIG. 19.

FIG. 18 depicts the next step in which the platinum layer 74 is formed on the surface of the platinum-rhodium layer 76. The dielectric layer 72 is then formed on the platinum-rhodium layer 76 by a sol-gel process, as shown in FIG. 19. During the heat treatment phase of the sol-gel process, a silicide layer 82 may be formed by an interaction between the titanium nitride layer 80 and silicon of the oxide layer 60 and/or the conductive plug 62, depending on the material of the conductive plug 62, as shown in FIG. 20. Formation of the silicide layer 82 results in a lower contact resistance between the titanium nitride layer 80 and the conductive plug 62.

Figure 21:
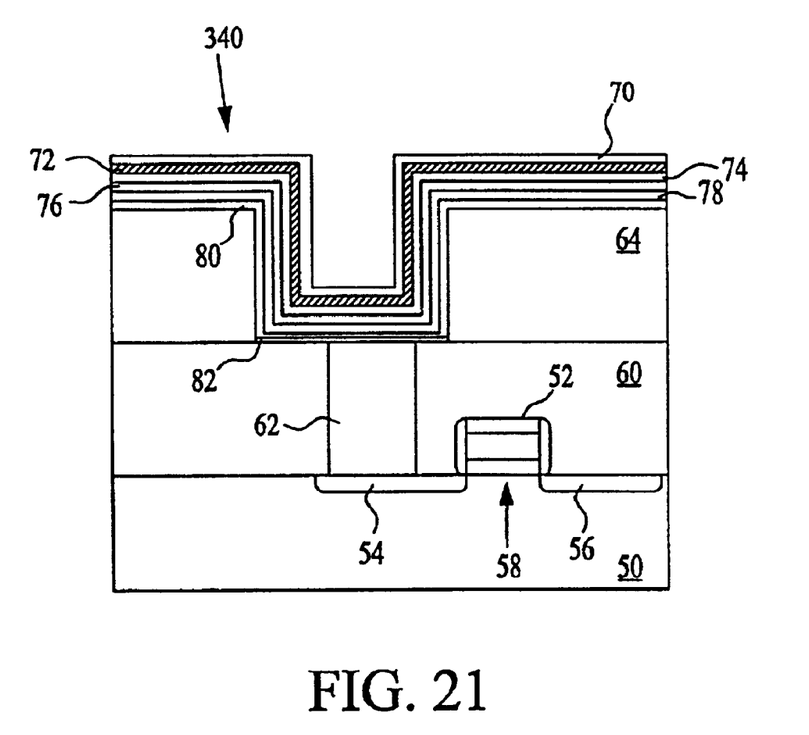
FIG. 21 shows the substrate of FIG. 15 at a processing step subsequent to that shown in FIG. 20.

Referring now to FIG. 21, the upper electrode 70 is formed on the dielectric layer, and may be a single layer of suitable conductive material, or a multilayer structure identical to that of the lower electrode, as is described above with reference to FIG. 8. The capacitor 340 now appears as shown in FIG. 21. Further steps to create a functional memory cell containing the capacitor may now be carried out, such as the formation and etching of insulating layers, e.g., BPSG, PSG, BSG, silicon dioxide or the like, to form conduits for electrical contacts (not shown), and for additional insulating, passivating, and wring interconnect layers.

As can be seen by the embodiments described herein, the present invention encompasses HDC and ferroelectric capacitors having multilayer electrode stacks, and processes of forming the same. As may be readily appreciated by persons skilled in the art, the platinum and platinum-rhodium layers of the lower electrode serve as oxidation barriers and exhibit improved adhesion to the substrate, thereby providing improved stability and performance of the capacitor.

Figure 22:
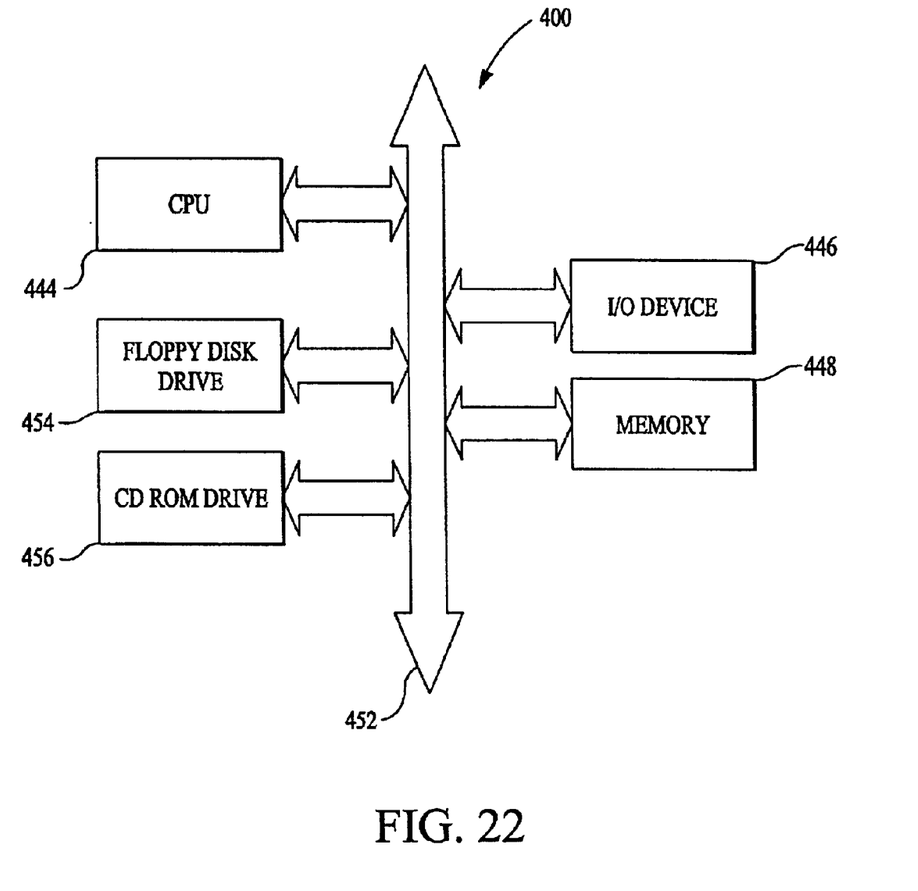
FIG. 22 is an illustration of a computer system having a ferroelectric capacitor according to the present invention.

A typical processor based system which includes a memory containing capacitors according to the present invention is illustrated generally at 400 in FIG. 22. A processor based system is exemplary of a system having digital circuits which could include ferroelectric or HDC capacitor devices. A processor system, such as a computer system, for example generally comprises a central processing unit (CPU) 444, e.g., a microprocessor, that communicates with an input/output (I/O) device 446 over a bus 452. The memory 448 also communicates with the system over bus 452. In the case of a computer system the processor system may include peripheral devices such as a floppy disk drive 454 and a compact disk (CD) ROM drive 456 which also communicate with CPU 444 over the bus 452. Memory 448 is preferably constructed as an integrated circuit which includes capacitors having multilayer electrodes, as previously described with respect to FIGS. 1 to 21. The memory 448 may be combined with a processor, such as a CPU, digital signal processor or microprocessor, with or without memory storage, in a single integrated circuit.

It should again be noted that although the invention has been described with specific reference to memory circuits and ferroelectric and HDC capacitors, the invention has broader applicability and may be used in any integrated circuit requiring capacitors. Similarly, the process described above is but one method of many that could be used. Accordingly, the above description and drawings are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A capacitor, comprising:
   an electrode having at least one layer comprising a platinum-rhodium material and at least one non-oxide layer comprising a platinum material on top and in direct contact with the platinum-rhodium layer, wherein the layer comprising platinum-rhodium comprises approximately 3 to approximately 40 percent rhodium and approximately 60 to approximately 97 percent platinum.

2. The capacitor of claim 1, wherein the platinum-rhodium layer has a thickness within the range of about 100 to about 800 Angstroms.

3. The capacitor of claim 1, wherein the platinum-rhodium layer has a thickness within the range of about 150 to about 300 Angstroms.

4. The capacitor of claim 1, wherein the platinum layer has a thickness within the range of about 50 to about 300 Angstroms.

5. The capacitor of claim 1, wherein the platinum layer has a thickness within the range of about 50 to about 150 Angstroms.

6. The capacitor of claim 1, further comprising a titanium layer beneath the platinum-rhodium layer.

7. The capacitor of claim 6, wherein the titanium layer has a thickness within the range of about 60 to about 200 Angstroms.

8. The capacitor of claim 6, wherein the titanium layer has a thickness within the range of about 60 to about 100 Angstroms.

9. The capacitor of claim 6, further comprising a titanium nitride layer beneath the titanium layer.

10. The capacitor of claim 9, wherein the titanium nitride layer has a thickness within the range of about 100 to about 200 Angstroms.

11. The capacitor of claim 9, wherein the titanium nitride layer has a thickness within the range of about 100 to about 150 Angstroms.

12. A capacitor, comprising:
a lower electrode comprising at least two layers, said first layer comprising a platinum-rhodium material and a second non-oxide layer comprising a platinum material in direct contact with the platinum-rhodium layer, wherein the layer consisting of platinum-rhodium is an alloy comprising approximately 3 to approximately 40 percent rhodium;
an upper electrode; and
a dielectric layer of a ferroelectric or high dielectric constant dielectric material formed between said lower and upper electrodes, wherein said dielectric layer is in contact with the platinum layer of said lower electrode.

13. The capacitor of claim 12, wherein the platinum-rhodium layer comprises an alloy comprising approximately 60 to approximately 97 percent platinum.

14. The capacitor of claim 12, wherein the platinum-rhodium layer has a thickness within the range of about 100 to about 800 Angstroms.

15. The capacitor of claim 12, wherein the platinum-rhodium layer has a thickness within the range of about 150 to about 300 Angstroms.

16. The capacitor of claim 12, wherein the platinum layer has a thickness within the range of about 50 to about 300 Angstroms.

17. The capacitor of claim 12, wherein the platinum layer has a thickness within the range of about 50 to about 150 Angstroms.

18. The capacitor of claim 12, further comprising a titanium layer beneath the platinum-rhodium layer.

19. The capacitor of claim 18, wherein the titanium layer has a thickness within the range of about 60 to about 200 Angstroms.

20. The capacitor of claim 18, wherein the titanium layer has a thickness within the range of about 60 to about 100 Angstroms.

21. The capacitor of claim 18, further comprising a titanium nitride layer beneath the titanium layer.

22. The capacitor of claim 21, wherein the titanium nitride layer has a thickness within the range of about 100 to about 200 Angstroms.

23. The capacitor of claim 21, wherein the titanium nitride layer has a thickness within the range of about 100 to about 150 Angstroms.

24. The capacitor of claim 12, wherein the upper electrode has a conductive layer.

25. The capacitor of claim 24, wherein the conductive layer is a layer of material selected from the group consisting of titanium nitride, tungsten nitride, platinum, and polysilicon.

26. The capacitor of claim 12, wherein the upper electrode has a platinum layer and a platinum-rhodium layer on top of the platinum layer.

27. The capacitor of claim 12, wherein the dielectric layer has a thickness of less than about 5000 Angstroms.

28. The capacitor of claim 12, wherein the dielectric layer has a thickness of less than about 500 Angstroms.

29. The capacitor of claim 12, wherein the dielectric material is a metallic oxide having a perovskite or ilmenite crystal structure and a dielectric constant of approximately 20 or higher.

30. The capacitor of claim 12, wherein the dielectric material is selected from the group consisting of PLZT, PST, BET, BT, and ST.

31. The capacitor of claim 12, wherein the dielectric material is BST.

32. The capacitor of claim 12, wherein the dielectric material is PZT.

33. The capacitor of claim 12, wherein the dielectric material is SBT.

34. The capacitor of claim 12, wherein the dielectric material is tantalum pentoxide.

35. A capacitor, comprising:
a lower electrode having a layer comprising a titanium material, an alloy layer on top of the layer comprising titanium, wherein the alloy layer consists of approximately 60 to approximately 97 percent platinum and approximately 3 to approximately 40 percent rhodium, and a non-oxide layer comprising platinum material on top of the alloy layer;
an upper electrode; and
a dielectric layer of a ferroelectric or high dielectric constant dielectric material formed between said lower and upper electrodes, wherein said dielectric layer is in contact with the layer comprising platinum material of said lower electrode.

36. The capacitor of claim 35, wherein the titanium layer has a thickness within the range of about 60 to about 200 Angstroms.

37. The capacitor of claim 35, wherein the titanium layer has a thickness within the range of about 60 to about 100 Angstroms.

38. The capacitor of claim 35, wherein the alloy layer has a thickness within the range of about 100 to about 800 Angstroms.

39. The capacitor of claim 35, wherein the alloy layer has a thickness within the range of about 150 to about 300 Angstroms.

40. The capacitor of claim 35, wherein the platinum layer has a thickness within the range of about 50 to about 300 Angstroms.

41. The capacitor of claim 35, wherein the platinum layer has a thickness within the range of about 50 to about 150 Angstroms.

42. The capacitor of claim 35, further comprising a titanium nitride layer beneath the titanium layer.

43. The capacitor of claim 42, wherein the titanium nitride layer has a thickness within the range of about 100 to about 200 Angstroms.

44. The capacitor of claim 42, wherein the titanium nitride layer has a thickness within the range of about 100 to about 150 Angstroms.

45. The capacitor of claim 35, wherein the upper electrode has a conductive layer.

46. The capacitor of claim 45, wherein the conductive layer is a layer of material selected from the group consisting of titanium nitride, tungsten nitride, platinum, and polysilicon.

47. The capacitor of claim 35, wherein the upper electrode has a platinum layer and a platinum-rhodium layer on top of the platinum layer.

48. The capacitor of claim 35, wherein the dielectric layer has a thickness of less than about 5000 Angstroms.

49. The capacitor of claim 35, wherein the dielectric layer has a thickness of less than about 500 Angstroms.

50. The capacitor of claim 35, wherein the dielectric material is a metallic oxide having a perovskite or ilmenite crystal structure and a dielectric constant of approximately 20 or higher.

51. The capacitor of claim 35, wherein the dielectric material is selected from the group consisting of BST, PZT, SBT, PLZT, PST, BBT, BT, ST and tantalum oxide.

52. A capacitor, comprising:
an electrode having at least one layer comprising a platinum-rhodium material and at least one non-oxide layer comprising a platinum material directly in contact with the platinum-rhodium layer, wherein the layer comprising platinum-rhodium material comprises approximately more than 20 percent rhodium.

53. A capacitor, comprising:
an electrode having at least one layer comprising a platinum-rhodium material and at least one non-oxide layer comprising a platinum material in direct contact with the platinum-rhodium layer, wherein the layer comprising platinum-rhodium material comprises approximately less than 10 percent rhodium.

* * * * *